United States Patent
Shiraishi

(10) Patent No.: US 6,556,037 B2
(45) Date of Patent: Apr. 29, 2003

(54) SEMICONDUCTOR INTEGRATED CIRCUIT AND TEST BOARD

(75) Inventor: Junya Shiraishi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 111 days.

(21) Appl. No.: 09/919,838

(22) Filed: Aug. 2, 2001

(65) Prior Publication Data

US 2002/0145441 A1 Oct. 10, 2002

(30) Foreign Application Priority Data

Apr. 9, 2001 (JP) .................................. 2001-110525

(51) Int. Cl.$^7$ .............................................. G01R 31/26
(52) U.S. Cl. ...................................... 324/765; 714/726
(58) Field of Search ............................... 324/73.1, 763, 324/765, 158.1; 714/724, 726–727, 729, 733, 738

(56) References Cited

U.S. PATENT DOCUMENTS 5,513,188 A * 4/1996 Parker et al. ............... 714/727
5,513,189 A * 4/1996 Savage ....................... 714/727
6,191,603 B1 * 2/2001 Muradali et al. ........... 324/765
6,446,230 B1 * 9/2002 Chung ........................ 714/726

FOREIGN PATENT DOCUMENTS

JP          7-63821          3/1995
JP          7-244127         9/1995

* cited by examiner

Primary Examiner—Kamand Cuneo
Assistant Examiner—Minh N. Tang
(74) Attorney, Agent, or Firm—Leydig, Voit & Mayer, Ltd.

(57) ABSTRACT

In a semiconductor integrated circuit, a test controller generates test patterns for all of the pins of a core logic from test patterns for only the pins necessary for the test. The test controller receives information on pins to be tested and first input test patterns including input values and output expectation values for the pins to be tested. The test controller sets the input values or output expectation values of pins which are not to be tested to predetermined values and generates a second input test pattern in which the input values or output expectation values of all the pins are set. The second input pattern is provided to the core logic. An output test pattern is obtained in exactly the reverse order.

9 Claims, 11 Drawing Sheets

FIG.3A

| PIN TO BE TESTED | P1 in | P3 i/o | P4 out | P5 out | P6 i/o | P10 out |
|---|---|---|---|---|---|---|
| PERIOD ↓ | 1 | H | L | — | L | H |
| | 0 | L | L | H | H | L |
| | 1 | L | H | H | H | L |
| | 0 | H | H | L | — | H |
| | 1 | 0 | L | L | 0 | L |
| | 1 | 1 | L | H | 1 | H |

1,0,X : INPUT VALUES
H,L,— : OUTPUT EXPECTATION VALUES

FIG.3B

| PIN | P1 in | P2 in | P3 i/o | P4 out | P5 out | P6 i/o | P7 out | P8 out | P9 in | P10 out |
|---|---|---|---|---|---|---|---|---|---|---|
| PERIOD ↓ | 1 | 0 | H | L | — | L | — | — | 0 | H |
| | 0 | 0 | L | L | H | H | — | — | 0 | L |
| | 1 | 0 | L | H | H | H | — | — | 0 | L |
| | 0 | 0 | H | H | L | — | — | — | 0 | H |
| | 1 | 0 | 0 | L | L | 0 | — | — | 0 | L |
| | 1 | 0 | 1 | L | H | 1 | — | — | 0 | H |

1,0,X : INPUT VALUES
H,L,— : OUTPUT EXPECTATION VALUES

FIG.11

| PIN | P1 | P2 | P3 | P4 | P5 | P6 |
|---|---|---|---|---|---|---|
| PERIOD | H | 1 | X | — | — | H |
| | L | 0 | X | H | — | L |
| | L | 1 | X | H | — | L |
| | H | 0 | X | L | — | — |
| | L | 1 | X | L | — | 0 |
| | H | 1 | X | H | — | 1 |

1, 0, X : INPUT VALUES
H, L, — : OUTPUT EXPECTATION VALUES

SEMICONDUCTOR INTEGRATED CIRCUIT AND TEST BOARD

FIELD OF THE INVENTION

The present invention relates to a semiconductor integrated circuit having therein a test controller for carrying out a test for verifying the semiconductor integrated circuit.

BACKGROUND OF THE INVENTION

Finer processing of a semiconductor integrated circuit (hereinbelow, also called an LSI (Large Scale Integrated Circuit)) enables a larger number of devices to be integrated on a chip. Particularly, the circuit scale is being enlarged at a very fast pace, for example, Moore's law predicts that "the number of transistors integrated on an IC will double approximately every 18 months". Also in a shipment test for screening a defective LSI, the scale of a circuit to be tested is inevitably being enlarged, so the test pattern necessary for the test is becoming more complicated, and the number of test patterns is increasing.

In order to facilitate a test conducted on such an LSI, a method called the JTAG (Joint Test Action Group) test defined by IEEE standard 1149.1 is used. The JTAG test is carried out by sequentially scanning all the external input/output pins of an LSI to input/output test data, thereby checking the internal function of the LSI and a printed circuit board on which the LSI is mounted. Therefore, a test according to the method is carried out on a precondition that an LSI as a circuit on the printed circuit board supports the JTAG testing method.

The JTAG test will be briefly described hereinbelow. FIG. 10 is a diagram showing a schematic configuration of a test system for explaining the JTAG testing method. The LSI 800 compatible with the JTAG standards has therein not only the core logic 810 having the inherent functions of the LSI, but also a test logic constructed by four registers and a TAP (Test Access Port) controller 830 for controlling the registers. The registers are divided into data registers and instruction registers. The data resisters include boundary scan registers (BSR), bypass registers, and option registers. The instruction register, bypass register, and option register have not been shown FIG. 1.

The LSI 800 is largely different from other LSIs with respect to the point that a shift register, called a cell 821, is disposed between the core logic 810 and each of the pins of the LSI. By the cells 821, an event occurring at each of the pins can be observed. That is, the cell 821 has the same function as a test probe. The BSR 820 is obtained by connecting the cells 821 in series and has the important function in the JTAG test. As the number of pins of the LSI increases, the number of bits of the BSR 820 also increases.

The JTAG test method is conducted in two operational modes of a normal mode and a test mode. In the normal mode, the LSI 800 performs normal operation without recognizing the existence of the BSR 820. Consequently, data passing through each of the pins of the LSI 800 can be captured at an arbitrary timing without exerting an influence on the operation of the LSI 800. The captured data is shifted a plurality of times, resultant data is outputted from a terminal TDO, and received and verified by an LSI tester 850 for shipping (hereinbelow, simply called a tester). In such a manner, the LSI 800 under the operating condition can be observed.

On the other hand, in the test mode, the core logic 810 in the LSI 800 is isolated from the pins. Consequently, the core logic 810 of the LSI 800 cannot substantially receive/send data from/to the outside of the LSI, and only data of a test pattern is given from the BSR 820. In the test mode, first, by using an EWS (Engineering Work Station) or the like, data (hereinbelow, called a test pattern) supplied by the BSR 820 to each of the pins is generated, and the test pattern is supplied to a terminal TDI of the LSI 800 via the tester 850. The tester 850 supplies a control program which runs on a TAP controller 830 to the terminal TDI as necessary.

The TAP controller 830 supplies the input test pattern to the core logic 810 at a timing according to a predetermined control program and outputs the result from the terminal TDO. In a manner similar to the normal mode, the tester 850 receives the output pattern from the terminal TDO and verifies the LSI 800.

On the side of the tester, however, there is a limitation in the size of a memory mounted for storing test patterns, of which the number increases as the scale of the LSI is enlarged. When a test for all circuit functions of the LSI is conducted, the test has to be conducted a plurality of times. When the test is conducted a plurality of times, the pre-shipment test time largely increases, the manufacturing throughput of the LSI deteriorates, and the manufacturing cost of the LSI increases.

In practice, as a testing method other than the JTAG testing method, a testing method called a scan test is generally carried out in the field of an ASIC (Application Specific IC) and the like. The scan test is realized by test facilitating designing for preliminarily carrying out wiring dedicated to a test so that test data can be directly written in a register in the LSI. Under the current circumstances, however, also in the scan test, an event such that the memory size of the tester becomes short often occurs.

It is, therefore, very important to conduct a shipment test of the same contents (circuit functions) by using test patterns as little as possible. In the conventional testing method, input patterns and output expectation values are prepared for all the input/output pins. The input values and output expectation values of pins which are unnecessary for a test are also loaded on the tester in spite of the fact that the values become invalid at the time of the test, and the memory is cluttered with the values.

FIG. 11 is a diagram for explaining the problems of the conventional testing method. As shown in FIG. 11, the tester 850 loads, for example, test patterns for the pins P1 to P6 shown in FIG. 10 in a full period on the memory of the tester 850, enters an input pattern, and compares an output pattern with output expectation values every period. The output pin P3 and the input/output pin P5 are pins unnecessary for the test. However, patterns which are substantially invalid are prepared also for the pins P3 and P5.

SUMMARY OF THE INVENTION

It is an object of this invention to obtain a semiconductor integrated circuit having therein a test controller for generating test patterns for all of pins from test patterns only for pins which are necessary for a test.

In the semiconductor integrated circuit according to the present invention, the test controller generates test patterns for all the pins from test patterns for only pins necessary for the test. The test controller receives information on pins to be tested and first input test patterns constructed by input values and output expectation values for the pins to be tested. The test controller sets the input values or output expectation values of pins which are not to be tested to predetermined values and thereby generates a second input test pattern in which the input values or output expectation values of all the pins are set. The second input pattern is provided to the core logic. The core logic outputs values to predetermined pins in accordance with the second input test pattern. The test controller discards output values corresponding to each of the pins that are not to be tested from the obtained first output test pattern and thereby generates a second output test pattern in which output values corresponding to each of the pins that are to be tested are set. Finally, the test controller outputs the second output test pattern generated by the output test pattern generation unit to the tester.

The test board according to the present invention can mount a plurality of the semiconductor integrated circuits according to the present invention.

Other objects and features of this invention will become apparent from the following description with reference to the accompanying drawings.

BRIEF DESCRIPTION OF THE DRAWINGS

FIG. 3A and FIG. 3B are diagrams showing an example of test patterns generated by encoding in the first embodiment;

FIG. 11 is a diagram for explaining problems of a conventional testing method.

DESCRIPTION OF THE PREFERRED EMBODIMENTS

Embodiments of a test controller according to the invention will be described in detail hereinbelow with reference to the accompanying drawings. The invention is not limited by these embodiments.

Figure 1:
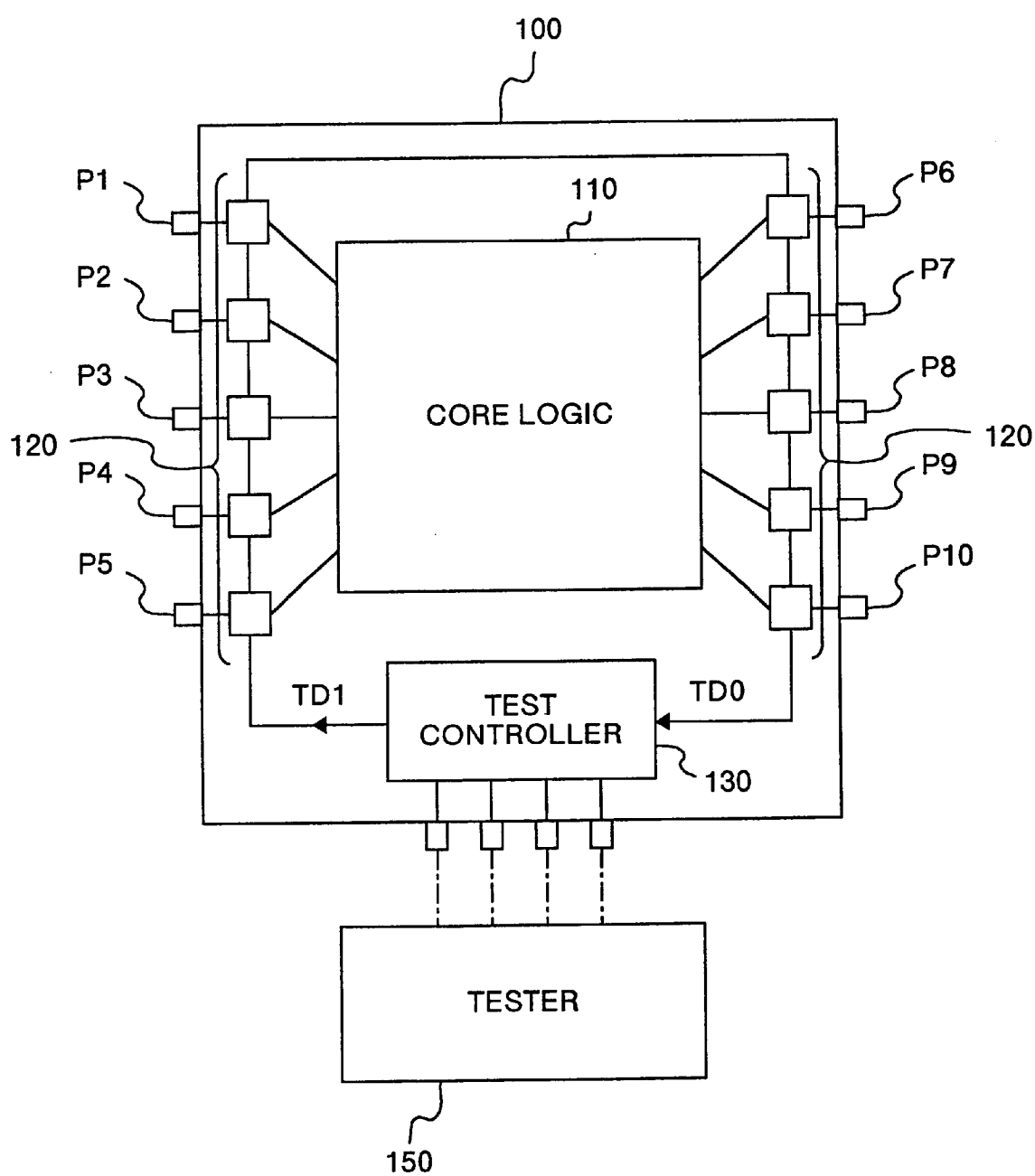
FIG. 1 is a block diagram showing a schematic configuration of a test system for explaining a semiconductor integrated circuit according to a first embodiment.

A semiconductor integrated circuit according to a first embodiment will be described first. FIG. 1 is a block diagram showing a schematic configuration of a test system for explaining the semiconductor integrated circuit according to the first embodiment. The LSI 100 has the BSR 120 for supporting the JTAG testing method. On the LSI 100, in place of the conventional TAP controller, a test controller 130 is mounted. The test controller 130 receives a test pattern and sends an output pattern from/to a tester 150, receives output patterns from cells connected to a terminal TDO as in the conventional LSI, and sends the input patterns to cells connected to a terminal TDI of the conventional LSI. It is assumed that the test controller 130 has the basic functions of the TAP controller.

Figure 2:
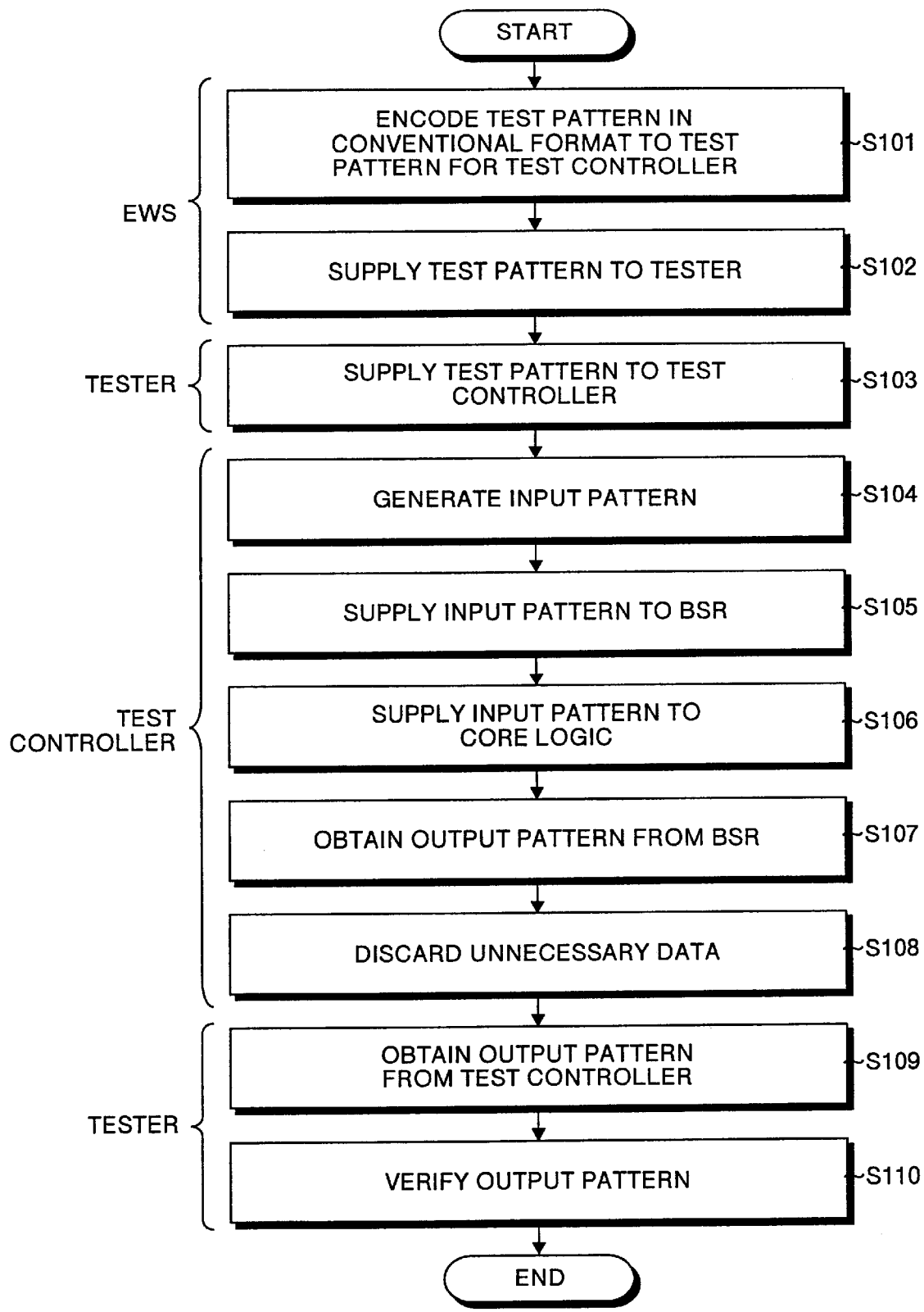
FIG. 2 is a flowchart showing the flow of a testing method in the first embodiment.

The flow of the testing method by the test system using the test controller will be described with concentration on the operation of the test controller in the semiconductor integrated circuit according to the first embodiment. FIG. 2 is a flowchart showing the flow of the testing method in the first embodiment. First, in an EWS, a test pattern in a format similar to that generated for the conventional JTAG test is prepared and encoded into a test pattern in a format which can be recognized by the test controller 130 (step S101).

FIG. 3A and FIG. 3B are diagrams showing an example of the test patterns generated by the encoding in the EWS. Assuming now that the pins to be tested are P1, P3, P4, P5, P6, and P10 in the pins PI to P10 shown in FIG. 1, by the encoding process of the EWS, from test patterns in a conventional format before the encoding process, that is, test patterns in which input values and output expectation values are set for all of the pins P1 to P10 in the full test period, as shown in FIG. 3A, test patterns in which input values and output expectation values only for the pins P1, P3, P4, P5, P6, and P10 to be tested are set are generated.

The EWS supplies the generated test patterns to the tester 150 (step S102). The tester 150 loads the test patterns for the test controller 130 from the EWS, and supplies the test patterns to the test controller 130 built in the LSI 100 in a test mode (step S103). Data is transferred between the tester 150 and the test controller 130 only via the input/output pins of the test controller 130.

As described above, the tester 150 loads only the information of pins actually necessary for a test and the test patterns constructed by the input values and output expectation values for the pins into the memory. Consequently, as compared with the conventional case of loading the test patterns for all of the pins, the occupying size in the memory can be reduced remarkably.

Subsequently, the test controller 130 analyzes the test patterns received from the tester 150 and generates an input pattern for the input pin to the core logic 110 in the LSI 100 (step S104). Specifically, the test controller 130 assigns proper values which are not contradictory to a pin which is not to be tested in the test patterns received from the tester 150. For example, the logic value of "1" or "0" is set to the input pin for which the test is unnecessary. FIG. 3B is a diagram showing an example of input patterns generated by the test controller 130. In FIG. 3B, "0" is set for the input pins for which the test is unnecessary. Since the output pins are not inherently a target of comparison, a proper logic value is similarly set as an output expectation value.

The test controller 130 latches the generated input patterns in the cells in the BSR 120 in a manner similar to the JTAG scan test (step S105). By supplying a system clock received from the tester 150 to the core logic 110, the test controller 130 supplies the input value latched in each cell to the core logic 110 (step S106). By the operation, the input pattern actually acts on the core logic 110. The system clock is supplied via a terminal TCK compatible with the JTAG standards, assigned as one of the input terminals of the test controller 130.

The core logic 110 receives the input pattern and outputs output values according to the input pattern to an output pin. The output value is latched in a cell in the BSR 120 in a manner similar to the input value. The test controller 130 obtains data stored in the BSR 120 as an output pattern (step S107).

The output pattern obtained by the test controller 130 at this stage is constructed by the values of the cells corresponding to all of the pins in the core logic 110. The test controller 130 extracts only data of the output pins to be tested from the output pattern and discards the other unnecessary data, thereby reconstructing the output pattern (step S108).

The test controller 130 outputs the reconstructed output pattern to the tester 150, and the tester 150 receives the output pattern (step S109). Since the test patterns as shown in FIG. 3A have been already loaded onto the memory in step S102, the tester 150 compares the output expectation values of the output pin or input/output pin in the test pattern with the output pattern obtained from the test controller 130 to thereby verify the output pattern (step S110). In such a manner, whether the core logic 110 is good or defective is determined.

As described above, in the semiconductor integrated circuit according to the first embodiment, the information of pins to be tested and the test patterns constructed by input values and output expectation values for the pins are received, proper values are as the input values or output expectation values for a pin which is not the target of the test, thereby generating the input patterns in which the input values and output expectation values for all of the pins in the core logic 110 are set, and the generated input patterns are supplied to the pins via the BSR 120. The test patterns loaded on the memory by the tester 150 are not conventional ones in which the input values and output expectation values for all of the pins are set but patterns of minimum information necessary for the test. As a result, the memory resources can be effectively used in the tester 150, and it becomes unnecessary to mount a memory of a large capacity. Thus, reduction in cost is realized.

A semiconductor integrated circuit according to a second embodiment will now be described. The semiconductor integrated circuit according to the second embodiment is characterized in that a test controller built in the circuit uses a pattern format (test pattern in a serial format to a specific pin) of an existing scan test as a test pattern to be supplied to the tester.

Figure 4:
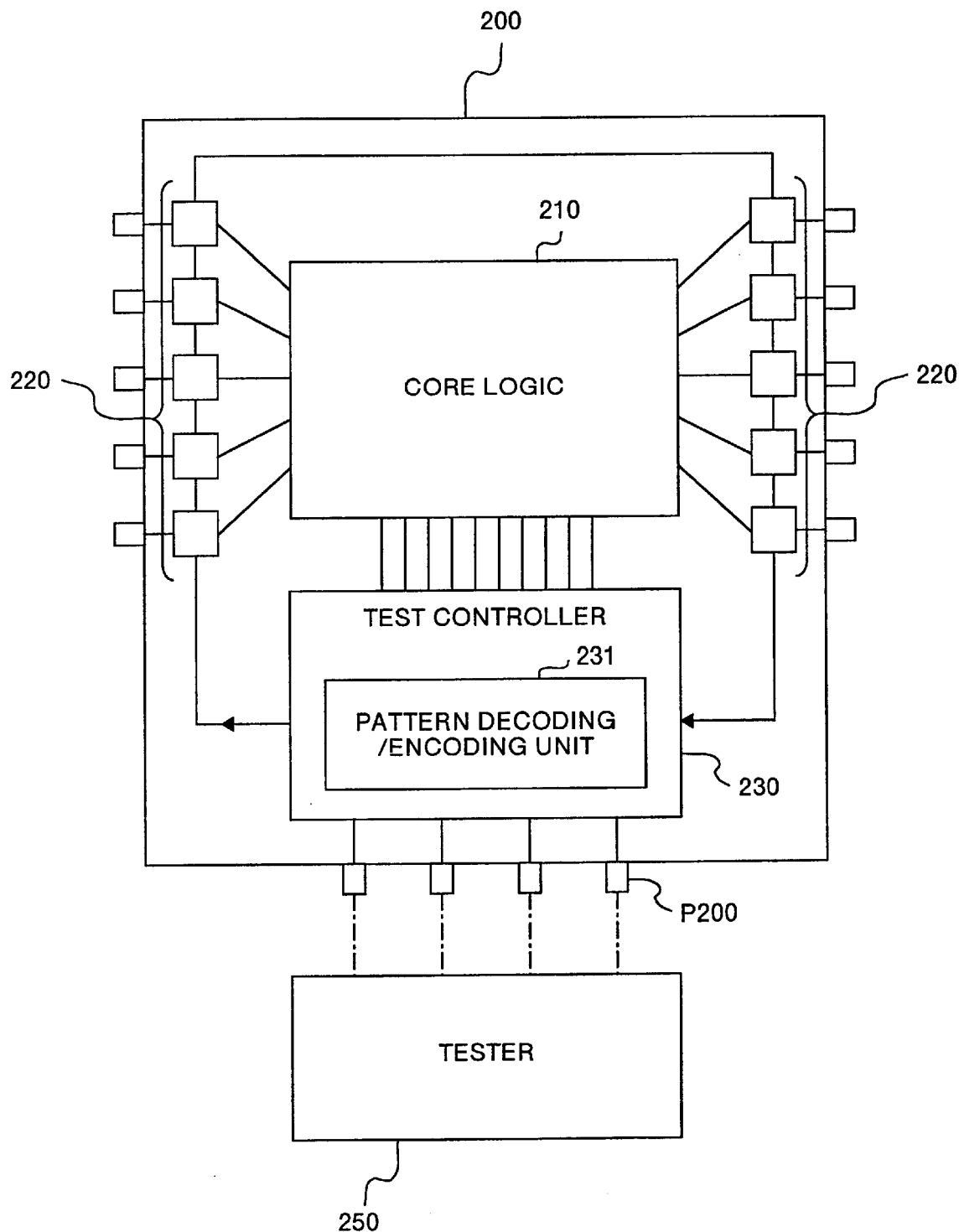
FIG. 4 is a block diagram showing a schematic configuration of a test system for explaining a semiconductor integrated circuit according to a second embodiment.

FIG. 4 is a block diagram showing a schematic configuration of a test system for explaining the semiconductor integrated circuit according to the second embodiment. The LSI 200 has, in a manner similar to FIG. 1 described in the first embodiment, the core logic 210 and BSR 220 connected to the core logic 210. Different from the first embodiment, a test controller 230 has therein a pattern decoding/encoding unit 231.

The pattern decoding/encoding unit 231 decodes a test pattern in a scan test format received from a tester 250 to generate an input pattern peculiar to the test controller 230 and encodes an output pattern obtained via the BSR 220 to a test pattern in the scan test format. The test pattern in the scan test format is received/sent via a virtual scan-in (SI)/scan-out (SO) pin P200 connected to the test controller 230.

Figure 5:
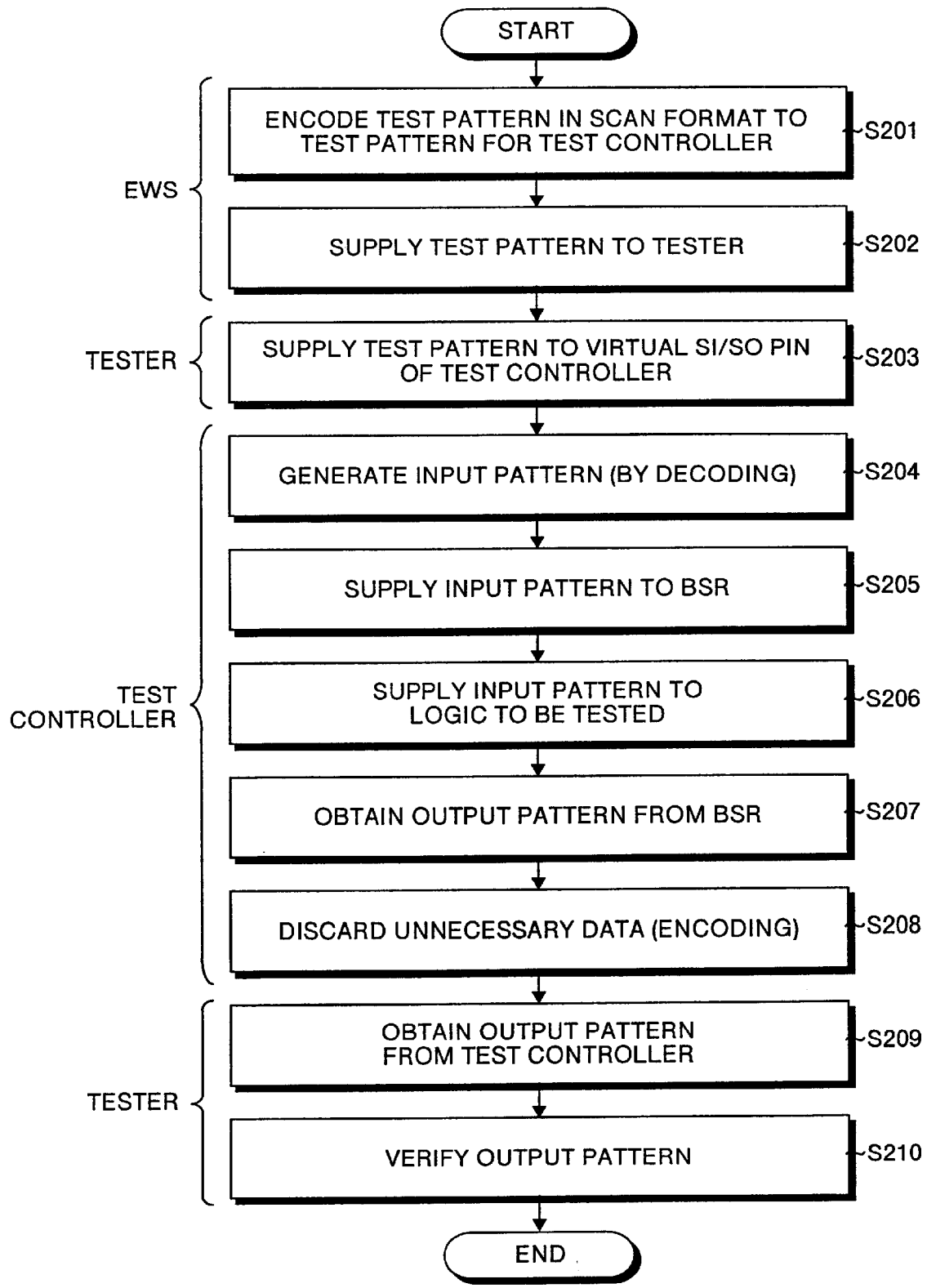
FIG. 5 is a flowchart showing the flow of a testing method according to the second embodiment.

The flow of a testing method by the test system using the test controller will be described hereinbelow with concentration on the operation of the test controller of the semiconductor integrated circuit according to the second embodiment. FIG. 5 is a flowchart showing the flow of the testing method in the second embodiment. First, in an EWS, test patterns in a format similar to that generated for the conventional scan test are prepared and encoded into a test pattern in a format which can be recognized by the test controller 230 (step S201). Particularly, the test patterns generated by the encoding operation are constructed by, in a manner similar to the first embodiment, input values and output expectation values for only the pins necessary for the test.

The EWS supplies the generated test patterns to the tester 250 (step S202). The tester 250 loads the test patterns for the test controller 230 from the EWS, and supplies the test patterns to the test controller 230 in the LSI 200 via the virtual SI/SO pin P200 in a test mode (step S203).

In a manner similar to the first embodiment, the tester 250 loads only the information of pins necessary for a test and the test patterns constructed by the input values and output expectation values for the pins into the memory. Consequently, the memory is not cluttered so much.

Subsequently, the test controller 230 decodes the test patterns in the scan test format received from the tester 250 via the virtual SI/SO pin P200 by the pattern decoding/encoding unit 231 to thereby generate an input pattern for the input pin to the core logic 210 in the LSI 200 (step S204). In a manner similar to the first embodiment, the input pattern is generated by assigning a proper value which is not contradictory to a pin which is not a test target.

The test controller 230 latches the generated input pattern in the cells in the BSR 220 in a manner similar to the JTAG scan test (step S205) and supplies the latched input values to the core logic 210 (step S206).

The core logic 210 receives the input pattern and outputs output values according to the input pattern to an output pin. The test controller 230 obtains data stored in the BSR 220 as an output pattern (step S207).

In a manner similar to the first embodiment, the test controller 230 reconstructs the output pattern by discarding unnecessary data and encodes the reconstructed output pattern into an output pattern in the scan test format similar to that received from the tester 250 by the pattern decoding/encoding unit 231 (step S208).

The test controller 230 sends the encoded output pattern to the tester 250 via the virtual SI/SO pin P200, and the tester 250 receives the output pattern (step S209). Since the test pattern in the scan test format including output expectation values has been already loaded onto the memory in step S202, the tester 250 compares the output expectation value for the output or input/output pin in the test pattern with the output pattern obtained from the test controller 230 to thereby verify the output pattern (step S210). In such a manner, whether the core logic 210 is good or defective is determined.

As described above, in the semiconductor integrated circuit according to the second embodiment, the test controller 230 is provided with the virtual SI/SO pin P200 capable of receiving/outputting a test pattern in the scan test format. By decoding the input test patterns in the scan test format, test patterns corresponding to all of the pins of the core logic 210 are generated. By discarding unnecessary data in the output patterns obtained via the BSR 220, the input test patterns are encoded into test patterns in the scan test format. Consequently, the effects of the first embodiment are produced. Moreover, since it is seen from that tester 250 that a normal scan test is conducted, the function of the scan test peculiar to the tester 250 can be used.

Thus, in a manner similar to the scan test, a test of high efficiency by loading patterns only for necessary pins to the tester memory can be realized. Without the necessity of modifying the existing tester or expanding the function, the same tester connection board (DUT board) as that used for the other tests can be used.

A semiconductor integrated circuit according to a third embodiment will now be described. The semiconductor integrated circuit according to the third embodiment is characterized in that a test controller built in the circuit has, in addition to the configuration of the test controller in the second embodiment, a pattern decompressing unit for decompressing a test pattern string and a pattern compressing unit for compressing the test pattern, thereby further increasing the use efficiency of the memory of the tester.

Figure 6:
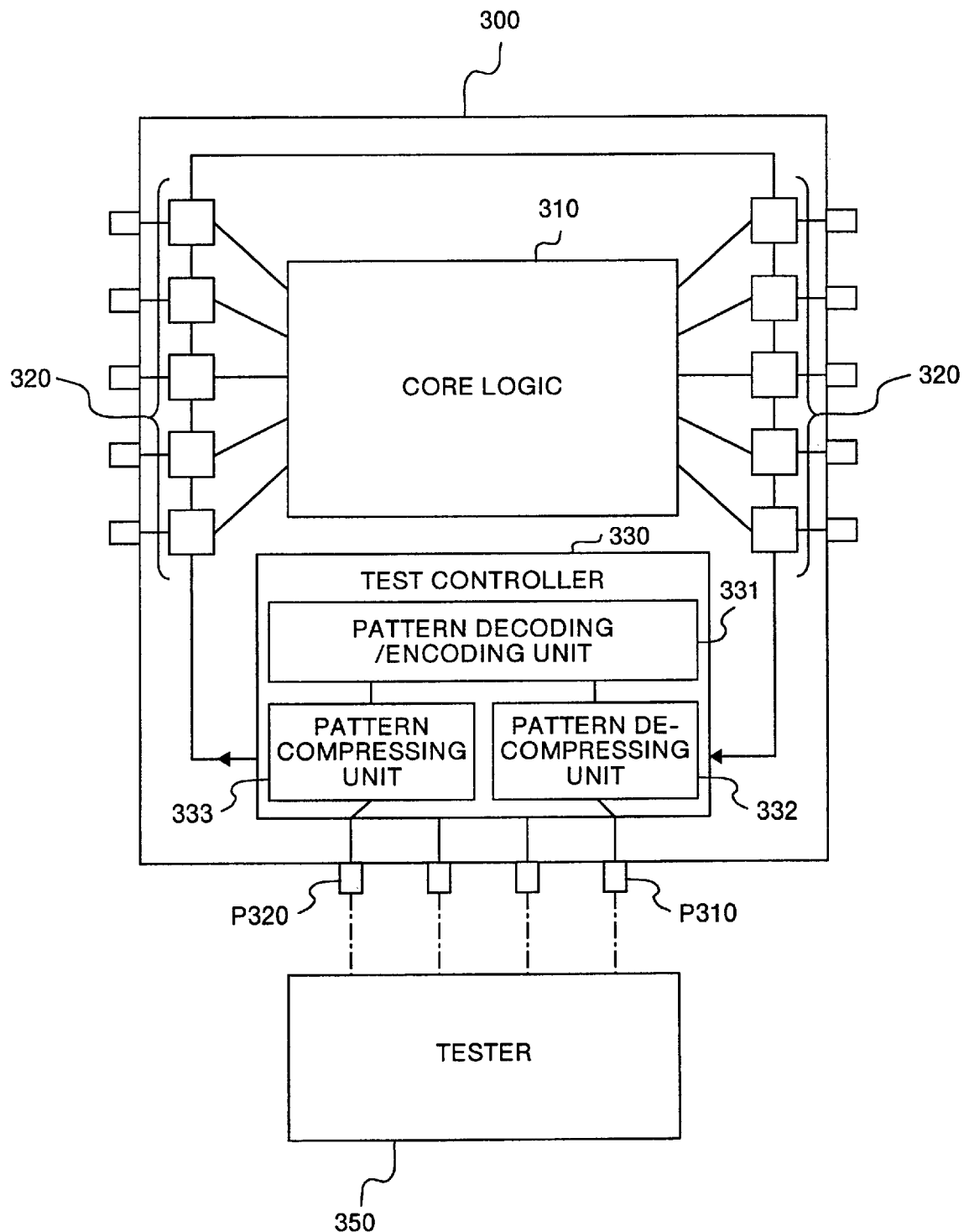
FIG. 6 is a block diagram showing a schematic configuration of a test system for explaining a semiconductor integrated circuit according to a third embodiment.

FIG. 6 is a block diagram showing a schematic configuration of a test system for explaining the semiconductor integrated circuit according to the third embodiment. The LSI 300 has, in a manner similar to FIG. 4 described in the second embodiment, the core logic 310, BSR 320 connected to the core logic 310, and the test controller 330 having therein a pattern decoding/encoding unit 331. The test controller 330 according to the third embodiment further has therein a pattern decompressing unit 332 and a pattern compressing unit 333.

The pattern decoding/encoding unit 331 performs, in a manner similar to the second embodiment, conversion between the test pattern in the scan test format and the test pattern in a format which can be recognized by the test controller 330. The test pattern is received/sent, not through the virtual SI/SO pin shown in FIG. 4, but through the pattern decompressing unit 332 and the pattern compressing unit 333. Specifically, the pattern decoding/encoding unit 331 decodes a test pattern subjected to the decompressing process by the pattern decompressing unit 332, and supplies an encoded test pattern to the pattern compressing unit 333.

The pattern decompressing unit 332 performs the decompressing process on the test pattern received through a virtual scan-in (SI) pin P310, and the pattern compressing unit 333 outputs a compressed test pattern from a virtual scan-out (SO) pin P320.

Figure 7:
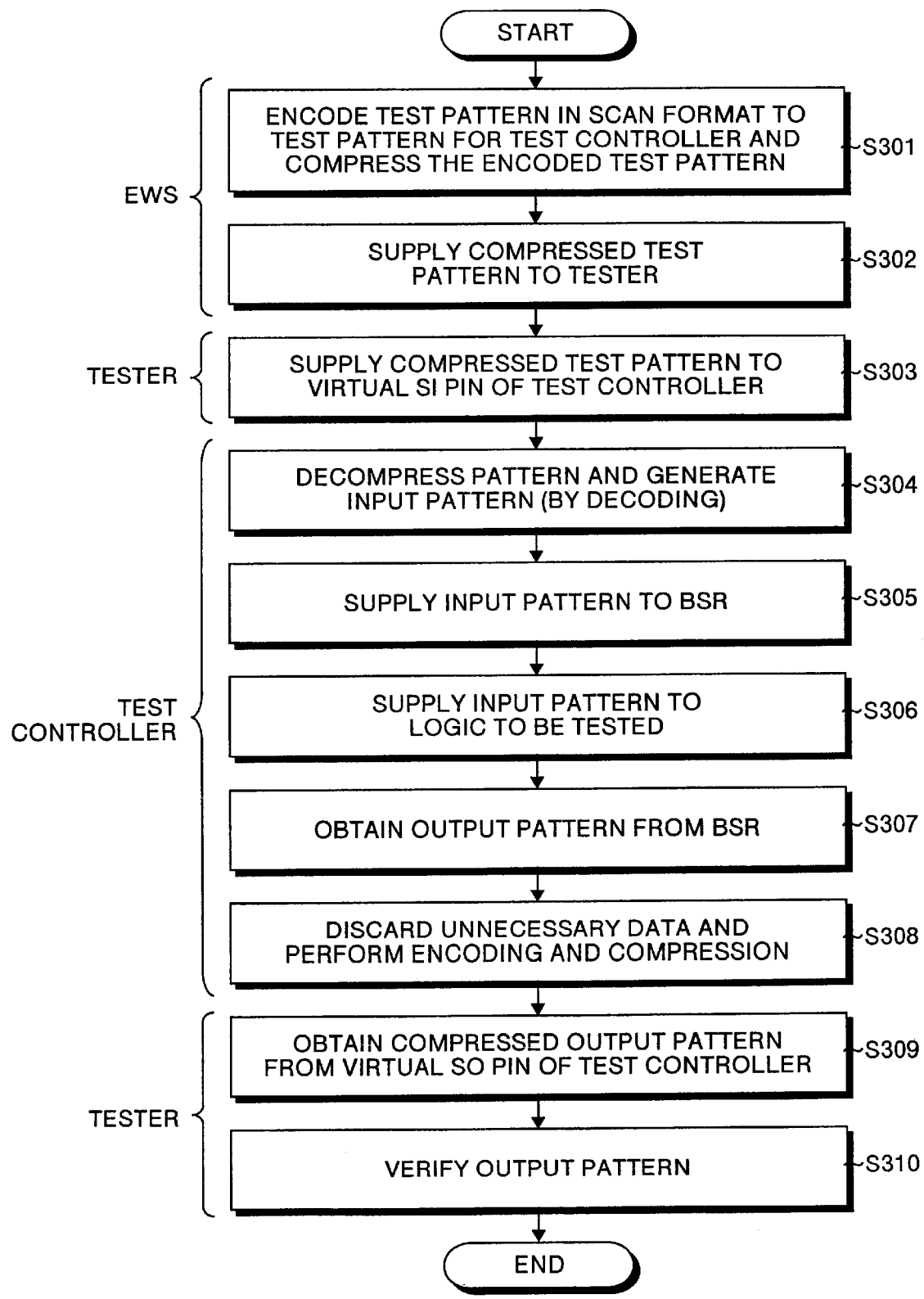
FIG. 7 is a flowchart showing the flow of a testing method in the third embodiment.

The flow of a testing method by the test system using the test controller will be described with concentration on the operation of the test controller of the semiconductor integrated circuit according to the third embodiment. FIG. 7 is a flowchart showing the flow of the testing method in the third embodiment. First, in an EWS, a test pattern in a format similar to that generated for the conventional scan test is prepared, encoded into a test pattern in a format which can be recognized by the test controller 330 in a manner similar to the second embodiment and, further, compressed (step S301).

The EWS supplies the generated test pattern to the tester 350 (step S302). The tester 350 loads the test pattern for the test controller 330 from the EWS, and supplies the test pattern to the test controller 330 built in the LSI 300 via the virtual SI pin P310 in a test mode (step S303).

In a manner similar to the second embodiment, the tester 350 loads only the information of pins necessary for a test and the test patterns constructed by the input values and output expectation values for the pins into the memory. Consequently, the memory is not cluttered so much.

Subsequently, the test controller 330 decompresses the compressed test pattern in the scan test format received from the tester 350 via the virtual SI pin P310 by the pattern decompressing unit 332 and, further, decodes the test pattern by the pattern decoding/encoding unit 331 to generate an input pattern for the input pin to the core logic 310 in the LSI 300 (step S304). In a manner similar to the second embodiment, the input pattern is generated by assigning a proper value which is not contradictory to a pin which is not a test target.

The test controller 330 latches the generated input pattern by the cells in the BSR 320 in a manner similar to the JTAG scan test (step S305) and supplies the latched input values to the core logic 310 (step S306).

The core logic 310 receives the input pattern and outputs output values according to the input pattern to an output pin. The test controller 330 obtains data stored in the BSR 320 as an output pattern (step S307).

In a manner similar to the second embodiment, the test controller 330 reconstructs the output pattern by discarding unnecessary data, encodes the reconstructed output pattern into an output pattern in the scan test format similar to that received from the tester 350 by the pattern decoding/encoding unit 331, and further compresses the output pattern by the pattern compressing unit 333 (step S308).

The test controller 330 outputs the encoded compressed output pattern to the tester 350 via the virtual SO pin P320, and the tester 350 receives the output pattern (step S309). Since the compressed test pattern in the scan test format including output expectation values has been already loaded onto the memory in step S302, the tester 350 compares the compressed data corresponding to the output expectation values for the output or input pin in the compressed test pattern with the compressed output pattern obtained from the test controller 330 to thereby verify the output pattern (step S310). In such a manner, whether the core logic 310 is good or defective is determined.

As described above, in the semiconductor integrated circuit according to the third embodiment, the test controller 330 is provided with the virtual SI pin P310 capable of receiving the test pattern in the scan test format and the virtual SO pin P320 capable of outputting a test pattern in the scan test format. The compressed input test patterns in the scan test format are decompressed and decoded to generate test patterns corresponding to all of the pins of the core logic 310. Unnecessary data in the output patterns obtained via the BSR 320 is discarded, thereby encoding the input test pattern into a test pattern in the scan test format and, after that, the test pattern is compressed. Consequently, the effects of the second embodiment are produced. Moreover, since the size of the test pattern loaded onto the tester memory is small because of the compression, the test with the increased use efficiency of the tester memory can be realized.

A semiconductor integrated circuit according to a fourth embodiment will now be described. In the semiconductor integrated circuits according to the first to third embodiments, the input value is supplied to each of the pins of the core logic and the output value from each pin is obtained by the shifting operation by the BSR. The semiconductor integrated circuit according to the fourth embodiment is characterized in that, by disposing a circuit switching device (hereinbelow, called a selector) in place of the cells in the BSR, the test pattern is directly supplied to each pin or obtained from each pin.

Figure 8:
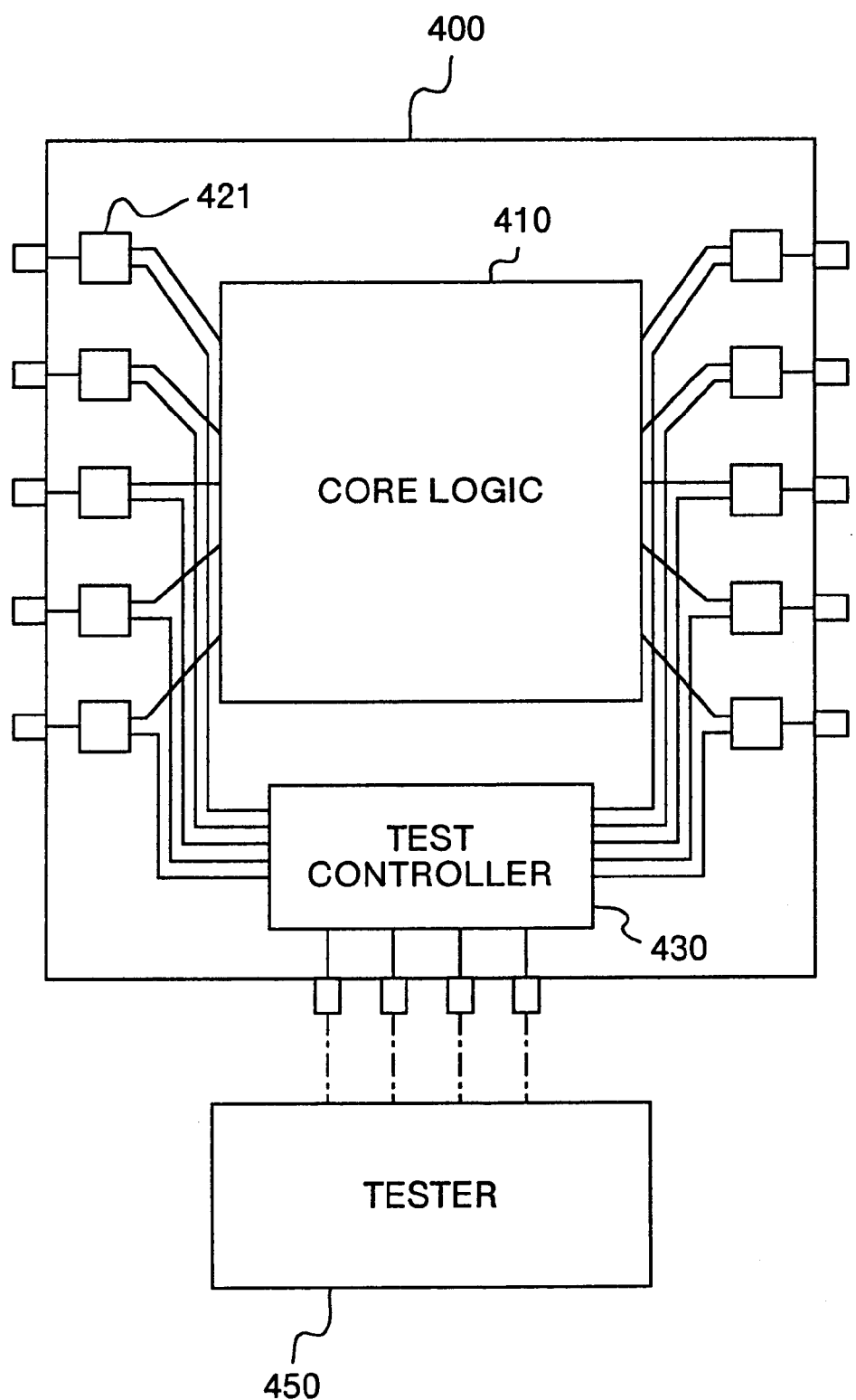
FIG. 8 is a block diagram showing a schematic configuration of a test system for explaining a semiconductor integrated circuit according to a fourth embodiment.

FIG. 8 is a block diagram showing a schematic configuration of a test system for explaining the semiconductor integrated circuit according to the fourth embodiment. The LSI 400 has a core logic 410, a plurality of selectors 421 each disposed between the core logic 410 and an external input/output pin, and a test controller 430 connected to each of the selectors 421. The configuration of the test controller 430 may be any of the configurations of the test controllers in the first to third embodiments, and a testing method according to any of the configurations of the first to third embodiments is used.

Specifically, in a test mode, the selectors 421 isolate the external input/output pins from the core logic 410, and data is supplied/received between the core logic 410 and directly the test controller 430 via the selectors 421.

As described above, in the semiconductor integrated circuit according to the fourth embodiment, the test controller 430 can receive/send the test pattern directly to the core logic 410 via the selectors 421 without performing the shifting process performed by the BSR or the like. Consequently, the test can be carried out faster than the case where the test pattern is received/sent via the BSR.

Figure 9:
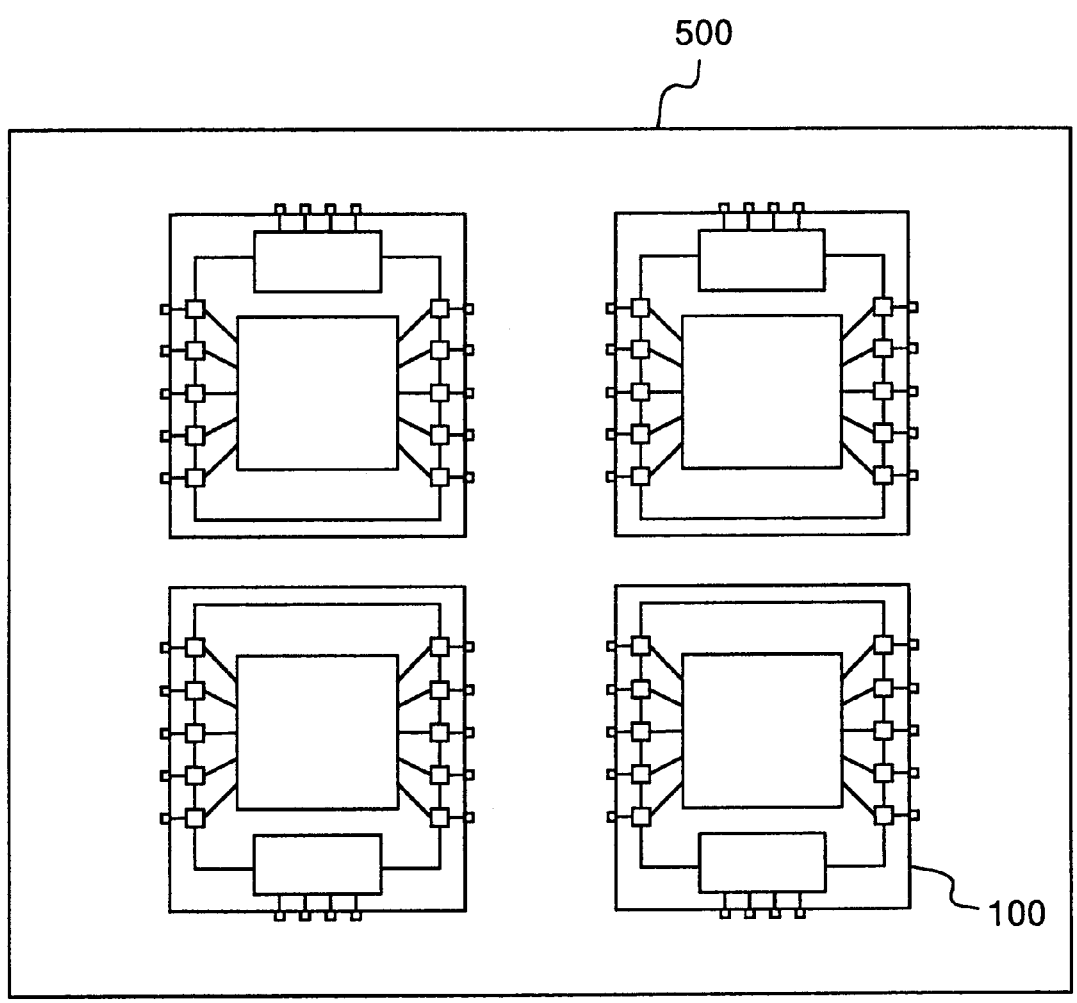
FIG. 9 is a diagram showing an example of a DUT board.
Figure 10:
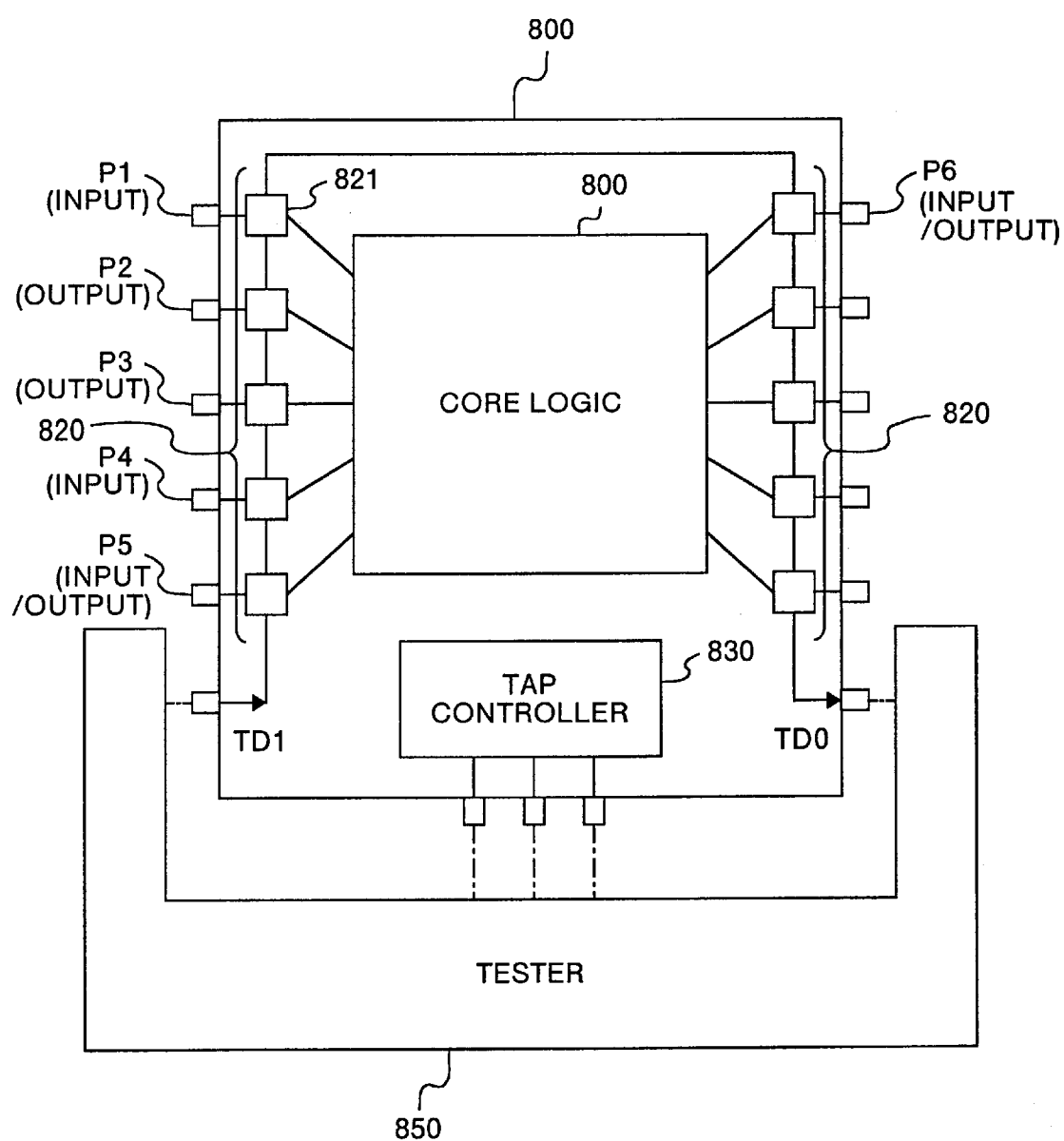
FIG. 10 is a diagram showing a schematic configuration of a test system for explaining a conventional JTAG testing method.

In the semiconductor integrated circuit according to any of the foregoing first to fourth embodiments, as the external input/output pins for receiving/sending data from/to the tester, only a small number of pins directly connected to the test controller are used. A test can be therefore conducted with pins of a smaller number than that of a normal LSI function test. By using the feature, a plurality of LSIs can be tested at a time by using a DUT board on which a plurality of LSIs can be mounted. FIG. 9 is a diagram showing an example of the DUT board. As shown in FIG. 9, by using a DUT board 500 dedicated to test on which the plurality of LSIs 100 can be mounted, a test for a logic circuit having a high memory use efficiency and a high test throughput is realized.

In a test carried out by the test controller in the semiconductor integrated circuit according to any of the first to fourth embodiments, the test pattern received/sent between the tester and the test controller is different from an input/output pattern directly received/sent from/to the core logic to be tested. Consequently, there is a problem such that it is difficult to specify the location of a failure in the pattern at the time of debugging the test pattern when the shipment test is started. At the time of carrying out a test, when the location of a failure is analyzed after the determination of a defective piece, the analysis is complicated in the pattern sent from the test controller. However, the problems can be easily solved by adding a checking function capable of debugging a test pattern debug and analyzing the location of a failure similar to that in the conventional LSI function test to application software for analysis which runs on the EWS.

As described above, according to the invention, by receiving the information of pins to be tested and the first input test patterns constructed by input values and output expectation values for the pins and setting the input values or output expectation values for each of pins which are not test targets to proper values, the second input test pattern in which input values or output expectation values are set for each of all of the pins of the core logic is generated, and the generated second input test pattern is supplied to the core logic via a boundary scan register or the like. The test pattern can be outputted in reverse order. Thus, the size of the test pattern supplied/received to/from the semiconductor integrated circuit can be set to the minimized size for the pins necessary for the test. As a result, the memory resources can be effectively used in the tester, and it becomes unnecessary to mount a memory of a large capacity. Thus, an effect such that reduced cost is realized is produced.

Furthermore, as a test pattern for a test supplied/received to/from the semiconductor integrated circuit, a test pattern in the scan test format can be used. As a result, it is seen from the tester that a normal scan test is conducted. Consequently, an effect such that the functions of the scan test peculiar to the tester can be used is produced.

Furthermore, as a test pattern for a test supplied/received to/from the semiconductor integrated circuit, a test pattern in the scan test format in a compressed state can be used. The size of the test pattern supplied/received to/from the semiconductor integrated circuit can be therefore further reduced. As a result, the test pattern loaded onto the memory in the tester can be reduced by the compression. Consequently, an effect such that a test with improved use efficiency of the tester memory is realized is produced.

Furthermore, the test controller can supply/receive the test pattern directly to/from the core logic without performing the shifting operation performed by the boundary scan register or the like. Thus, an effect such that a test can be conducted at a higher speed is produced.

Furthermore, a plurality of the semiconductor integrated circuits mounted on the test board can be tested at once. An effect such that a test of a logic circuit with improved memory use efficiency and high test throughput can be realized is produced.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit comprising a test controller for
   receiving, from a tester, a first input test pattern in which input values or output expectation values are set for each of pins selected to be tested from all of input/output pins of a core logic to be tested,
   setting the input values or output expectation values for each of the pins, except for the pins selected to be tested, to predetermined values to input the first input test pattern, thereby generating a second input test pattern in which the input values or output expectation values are set for each of the input/output pins of the core logic,
   supplying the second input test pattern to the core logic,
   obtaining a first output test pattern including output values of each of the input/output pins when the core logic sends output values to input/output pins in accordance with the second input test pattern,
   discarding output values corresponding to each of the pins, except for the pins to be tested, from the first output test pattern, thereby generating a second output test pattern in which output values corresponding to each of the pins selected to be tested are set, and outputting the second output test pattern to the tester.

2. The semiconductor integrated circuit according to claim 1, wherein said test controller
   receives a third input test pattern in a scan test format from the tester,
   converts the third input test pattern into the first input test pattern,
   converts the second output test pattern into a third output test pattern in a scan test format, and
   outputs the third output test pattern in the scan test format to the tester.

3. The semiconductor integrated circuit according to claim 1, wherein said test controller
   receives a compressed input test pattern in a scan test format from the tester,
   decompresses the compressed input test pattern,
   converts the compressed input test pattern, after decompression, into the first input test pattern, converts the second output test pattern into a third output test pattern in a scan test format, compresses the third output test pattern, and outputs the third output test pattern that has been compressed to the tester.

4. The semiconductor integrated circuit according to claim 1, including a selector for connecting an input/output pin to the test controller, located between the core logic and each of the input/output pins, and, in a test mode, the test controller is connected to the core logic via said selector and supplies, directly to and from the core logic, the second input test pattern, or obtains the first output test pattern.

5. A semiconductor integrated circuit comprising:

a core logic;

a plurality of input/output pins for input and output of signals to said core logic; and a test controller which controls said core logic, said test controller including a receiving unit which receives from a tester a first input test pattern in which input values or output expectation values are set for pins selected to be tested from said input/output pins;

an input test pattern generation unit which sets the input values or output expectation values for each of the pins that are not to be tested to predetermined values, based on the first input test pattern received by said receiving unit, and thereby generates a second input test pattern in which the input values or output expectation values are set for each of said input/output pins;

an output pattern obtaining unit which supplies the second input pattern generated by said pattern generation unit to said core logic, obtains a first output test pattern including output values of each of said input/output pins when said core logic outputs values to predetermined pins in accordance with the second input test pattern;

an output test pattern generation unit which discards output values corresponding to each of the pins that are not to be tested, from the first output test pattern, and thereby generates a second output test pattern in which output values corresponding to each of the pins selected to be tested are set; and an outputting unit which outputs the second output test pattern generated by said output test pattern generation unit to said tester.

6. The semiconductor integrated circuit according to claim 5, wherein, if said receiving unit receives an input test pattern in a scan test format from said tester, then said receiving unit converts the input test pattern into the first input test pattern, and said outputting unit converts the second output test pattern into an output test pattern in a scan test format, and outputs the output test pattern in the scan test format to said tester.

7. The semiconductor integrated circuit according to claim 5, wherein, if said receiving unit receives a compressed input test pattern in a scan test format from said tester, then said receiving unit decompresses the input test pattern, and, converts the input test pattern, after decompression, into the first input test pattern, and said outputting unit converts the second output test pattern into an output test pattern in a scan test format, compresses the output test pattern, and outputs the output test pattern, after compression, to said tester.

8. The semiconductor integrated circuit according to claim 5, further comprising a selector connecting said input/output pins to said core logic and which connects said input/output pins to said test controller, wherein, in a test mode, said test controller is connected to said core logic via said selector, and supplies the second input test pattern to said core logic or obtains the first output test pattern from said core logic.

9. A test board comprising:

a mounting unit for mounting a plurality of semiconductor integrated circuits, each of said semiconductor integrated circuit including a core logic;

a plurality of input/output pins for input and output of signals to said core logic; and a test controller which controls said core logic, said test controller including a receiving unit which receives from a tester a first input test pattern in which input values or output expectation values are set for pins selected to be tested from said input/output pins;

an input test pattern generation unit which sets the input values or output expectation values for each of the pins that are not to be tested to predetermined values, based on the first input test pattern received by said receiving unit, and thereby generates a second input test pattern in which the input values or output expectation values are set for each of said input/output pins;

an output pattern obtaining unit which supplies the second input pattern generated by said pattern generation unit to said core logic, obtains a first output test pattern including output values of each of said input/output pins when said core logic outputs values to predetermined pins in accordance with the second input test pattern;

an output test pattern generation unit which discards output values corresponding to each of the pins that are not to be tested, from the first output test pattern, and thereby generates a second output test pattern in which output values corresponding to each of the pins selected to be tested are set; and an outputting unit which outputs the second output test pattern generated by said output test pattern generation unit to said tester; and connecting terminals for connecting at least some of said input/output pins of said semiconductor integrated circuit to said tester.

* * * * *